United States Patent [19]

MacNeal

[11] 4,423,489
[45] Dec. 27, 1983

[54] REPLICATOR FOR ION-IMPLANTED BUBBLE DOMAIN DEVICES USING STRETCHING ACTION OF CHARGED WALL

[75] Inventor: Bruce E. MacNeal, Fullerton, Calif.

[73] Assignee: Rockwell International Corporation, El Segundo, Calif.

[21] Appl. No.: 263,659

[22] Filed: May 14, 1981

[51] Int. Cl.³ ............................................. G11C 19/08
[52] U.S. Cl. ........................................ 365/12; 365/15; 365/36
[58] Field of Search ........................ 365/15, 16, 36, 12

[56] References Cited

U.S. PATENT DOCUMENTS 4,164,029 8/1979 Keefe ..................................... 365/12
4,253,159 2/1981 Nelson ................................... 365/12

Primary Examiner—James W. Moffitt
Attorney, Agent, or Firm—H. Fredrick Hamann; Daniel R. McGlynn

[57] ABSTRACT

A replicator for an ion-implanted magnetic bubble domain device including a single level conductor bubble cutting element disposed between first and second spaced apart bubble domain guide structures. The charged wall movement in response to the rotating in-plane field functions to stretch a bubble domain travelling along the first bubble propagation path onto the second bubble propagation path and the conductor element crossing the stretched domain functions in response to an activating signal on the conductor to cut the bubble.

8 Claims, 5 Drawing Figures

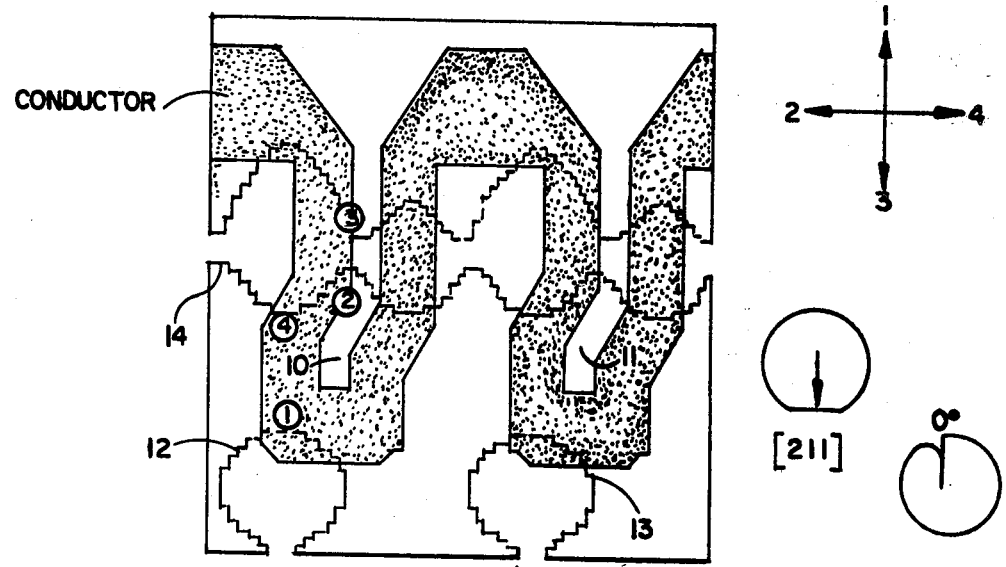
FIG. 1 PRIOR ART
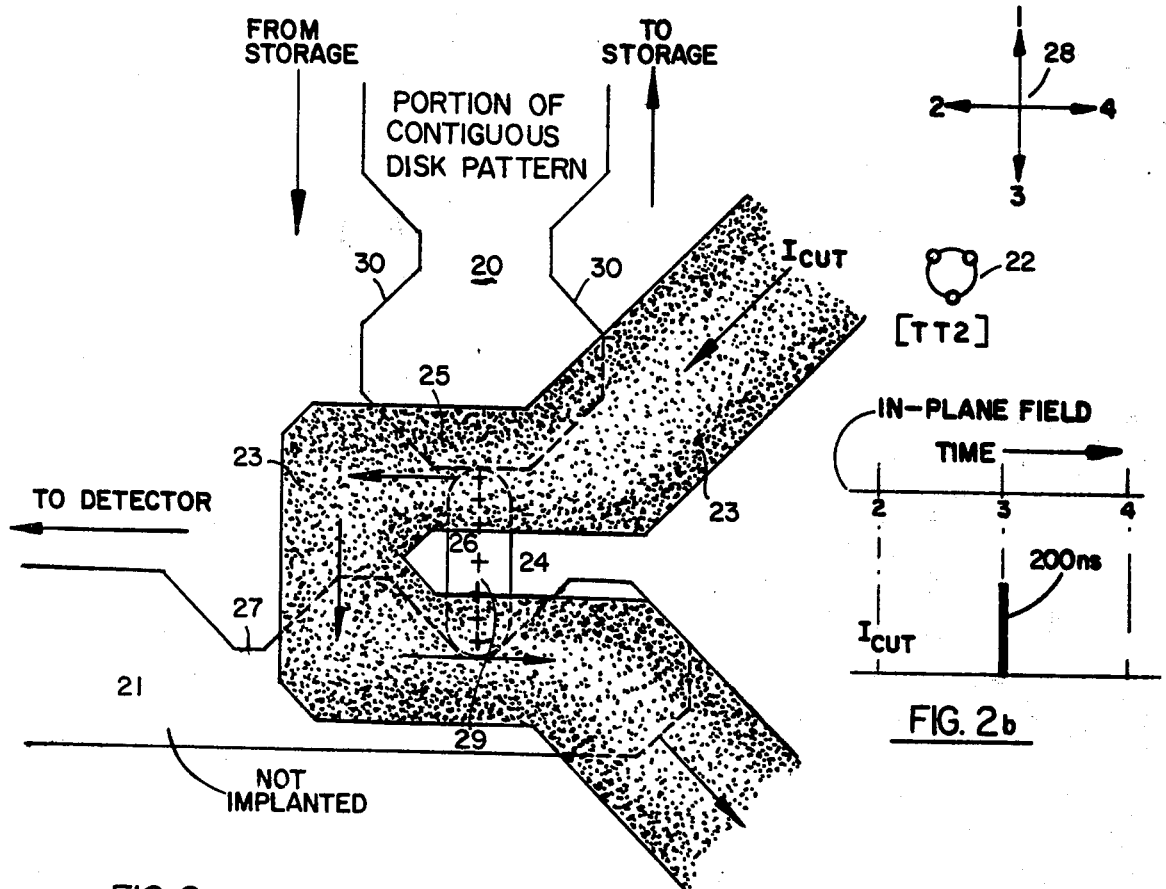
FIG. 2a
FIG. 2b

4,423,489

REPLICATOR FOR ION-IMPLANTED BUBBLE DOMAIN DEVICES USING STRETCHING ACTION OF CHARGED WALL

TECHNICAL FIELD OF THE INVENTION

The invention relates to magnetic bubble domain devices and in particular to bubble domain replicators for duplicating or replicating a magnetic bubble in a propagation path.

BACKGROUND OF THE INVENTION

Magnetic bubble domain devices are well known in the art. There are two basic types of devices depending upon the method by which bubbles are propagated in bubble devices; the first is the field access type and the second is the current (or conductor) access type. The most familiar mode of operating a magnetic bubble device is termed the "field-access" mode. In this mode, a pattern of magnetically soft elements (such as Permalloy) is formed in a plane adjacent a layer of material in which the bubbles are moved. Another technique uses ion-implantation in the bubble layer to form a pattern of contiguous disks. The bubble layer is typically a thin magnetic garnet film disposed on a suitable non-magnetic substrate. A magnetic field is generated in the plane of the layer and the field caused to reorient to incrementally-offset radial positions cyclically in the plane. Each element is so shaped that various portions thereof respond to in-plane field to generate pole-patterns which change as the field precesses. The configuration of adjacent elements sets up a sequence of travelling potential wells in the layer which causes bubble movement.

In current access devices, the necessary potential wells are provided by a set of conductor patterns in which polyphase, usually two or three phase, currents are transmitted. The conductors are typically formed in multiple layers, insulated from one another and driven in a two or three phase manner. An example of such a device is described in U.S. Pat. No. 3,460,116.

Various types of magnetic bubble domain device architectures are known in the prior art, one of the best known being the major loop/minor loop configuration. The major loop/minor loop configuration, such as described in U.S. Pat. No. 3,618,054, consists of a plurality of first recirculating "minor" channels and a second "major" channel.

Bubble replication is achieved in permalloy field access bubble devices by stretching the bubble then cutting it into two parts, one part is left in the primary track and the second is transferred to the secondary tracks. The bubble stretching is performed either by applying a high current pulse to the same conductor used for cutting the bubble or by utilizing some large size permalloy propagation elements such as the pickax element. Ion-implanted field access devices, however, lack the strong wide pole distribution necessary for stretching bubbles for successful replication over adequate bias range. Prior to the present invention, there has been a replicated design based upon the stretching action of a conductor together with a cutting action of the charged wall. Such configurations such as is known from the Nelson et al publication, "Ion-Implanted Bubble Circuit Design", 1980 Intermag, Boston, Paper 22-2. In such configurations the bias for face margins for replication are relatively narrow and the long term reliability of the passive charged wall may be disadvantageous in certain applications. There has, therefore, not been a simple and reliable replicator for use with ion-implanted devices which does not rely upon the stretching action of a conductor.

SUMMARY OF THE INVENTION

Briefly and in general terms, the invention concerns a replicator for magnetic bubble domain devices including first and second ion-implanted tracks for receiving and propagating a magnetic bubble domain, an expansion region in which a bubble domain from said first track is stretched between said first and said second tracks, and a replication device which intersects the expansion region and functions to cut the stretched bubble into two magnetic bubble domains, so that the replicated bubble domain travels along said second ion-implanted path.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWING

FIG. 1 is a top plan view of a bubble domain device which illustrates a replicated design using a hairpin loop strip out and charged wall cut according to the prior art;

FIG. 2a is a top plan view of a bubble domain device which illustrates a first embodiment of the replicator according to the present invention;

FIG. 2b is a timing diagram of the in-plane magnetic drive field and current in the conductor as used in the first embodiment present invention;

DESCRIPTION OF THE PREFERRED EMBODIMENTS

Figure 3A:
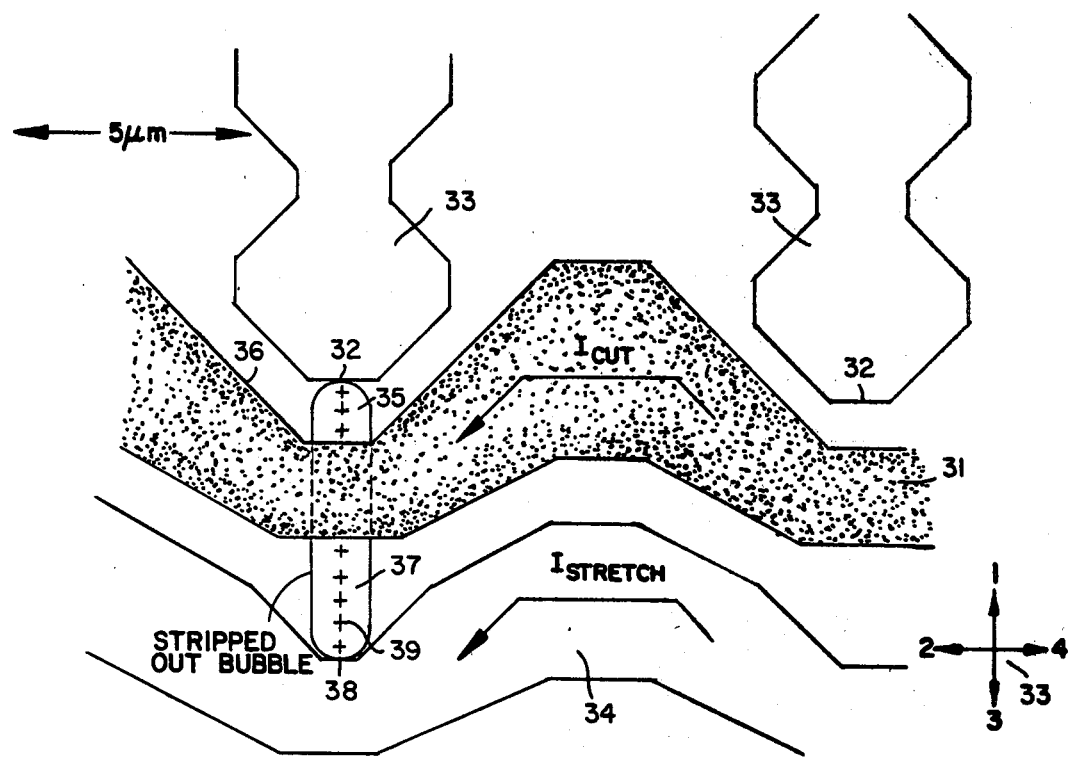
FIG. 3a is a top plan view of a bubble domain device which illustrates a second embodiment of a replicator according to the present invention.

The present invention is concerned with replicators for magnetic bubble domain devices of the ion-implanted field access type. The operation of the replicator according to the present invention is based upon making use of the charged walls of bubble domains which are responsible for bubble propagation for performing a bubble domain stretch, and using a conductor to perform the cutting function.

The present invention describes two embodiments of bubble replicators in which the stretching is performed by the action of the charged wall and the cutting is made with the assistance of the field associated with a conductor.

In the prior art, reliable replication has been difficult to achieve in ion-implanted magnetic bubble devices. In one prior art design, shown in FIG. 1, provides a topological transfer-out switch which acts as a replicator under certain conditions. More particularly, FIG. 1 shows orientation of the ion-implanted track with respect to the four directions of magnetization of the implant field, as well as the crystallographic axes or the easy direction of magnetization of the planar layer of magnetic material. The particular guide structure illustrated is formed by ion implantation of the magnetic garnet film to form a pattern of overlapping colinear contiguous disk elements. Although such a guide structure is illustrated in the two embodiments of the replicator according to the present invention the features of the present invention are not limited to any particular type of guide structure or geometry thereof.

An overlay conductor is shown which forms a number of hairpin loops, 10 and 11 which when provided with a current pulse which is used to stretch the bubble domain from a first propagation of track to a second propagation track. In the present example first propagation track includes minor loops 12 and 13 while the second propagation track is the major loop 14. The bubbles propagate around the exterior edges of the ion-implanted regions as is shown by bubble positions 1, 2, 3, and 4. The operation of the replicator according to the prior art is described as follows, making reference to the bubble positions designated in FIG. 1.

Normally, bubbles are brought to the top of the minor loops (Position 1) by counter-clockwise rotation of the in-plane field and a current pulse is used to stretch the bubble over to the lower cusp around phase 0°. When the stretch pulse is released, the bubble contracts to Position 2. At a somewhat later phase, 90°–154°, a second "invert" pulse is applied to stretch the bubble across to the top of the major loop, Position 3. The word "invert" is used here not to describe the nature of the pulse, but merely to label the pulse. When this pulse is removed, the bubble contracts to the top side of the major loop. For large "invert" pulse amplitudes, it was found that the bubble stretches back toward Position 4 as well as toward Position 3. When the stripe is held in this position long enough, a strong, negative charged wall forms at Position 2 and cuts the stripe. When the "invert" pulse is removed a replica of the bubble at Position 3 is found at Position 4. The bias and phase margins for replication according to such a prior art design to be rather narrow, and the long term reliability of the passive charged wall operation is also questionable.

Turning now to the present invention, the replication process described herein makes use of passive charged wall stretching and an active, current cut pulse. A first embodiment of the mechanism, according to the present inventor, is given by the serial replicator design shown in FIG. 2a.

FIG. 2a illustrates the first embodiment of the present invention wherein the charged wall is responsible for stretching the bubble domain and a conductor loop is responsible for cutting the domain. FIG. 2a is a top plan view of a bubble domain device which includes a planar layer of magnetic material in which magnetic bubble domains can be propagated, such as magnetic garnet film. A first bubble domain guide structure 20, in which bubbles travel along a path labelled "from storage" and "to storage" in the Figure, is provided which is coupled to the magnetic layer and defines the first bubble domain propagation path or track 30 for guiding the movement of bubble domains in the layer in response to a cyclical change in orientation of a re-orienting magnetic field in the plane of the layer.

A second bubble domain guide structure 20, in which bubbles travel along a path or track 27 labelled "to detector" in FIG. 2a, is provided which is coupled to the planar layer of magnetic material and defines a second propagation path for guiding the movement of other bubble domains in the layer in response to the cyclical change in the orientation of the re-orienting magnetic field in the plane of the layer. The crystallographic axes or the easy direction of magnetization of the planar layer of magnetic material are shown by the schematic diagram 22 in the right hand portion of the Figure. In the present embodiment, the bubble domain guide structures are formed by ion implantation of the magnetic garnet film. The particular guide structure illustrated is an overlapping pattern of colinear contiguous disk-like polygons or "contiguous disks" although the present invention is not limited to any particular structure.

The propagation track associated with guide structure 20 is oriented in a favored direction intersecting another propagation track associated with guide structure 21 at right angles with a hairpin conductor loop 23 positioned at the intersection, 24 as shown. The operation of the replicator is as follows, making reference to FIG. 2b, the timing diagram of the in-plane field, and current $I_{CUT}$ in the conductor 23. Bubbles are brought from a storage area to the tip 25 of the propagation track through counterclockwise rotation of the in-plane field. The "storage area" is that portion of a bubble device where bubbles representing data are located. A typical storage area, known in the prior art, is a minor loop. The guide structure 21 may represent a portion of such a minor loop. The bubble 26 is stretched as shown in FIG. 2b between two spaced apart attractive positions formed in response to movement of the charged wall. The term attractive position is used herein to designate the location of a bubble attractive position associated with a guide structure at a particular time during rotation of the re-orienting magnetic field in the plane of the layer. The tip 25 of the upper track 30 is placed as close as possible to the lower "super" attractive position (formed at the concave portion of the lower track) 27 so that when the rotating field is in quadrant 3 (shown in phase diagram 28), a bridging charged wall 29 is formed, indicated here by the plus signs enclosed within an elongated ellipse. Formation of this charged wall has been described by Lin et al, IEEE Trans. MAG-15, 1642 (1979), in connection with charged-wall-aided transfer switches. If the tip-cusp distance is short enough, a bubble at the tip will spontaneously strip out to the lower cusp. A large, short cut pulse typically 200 ns. in duration, as shown in FIG. 2b, is applied to the conductor loop 23 so that the resulting field in the center of the loop or intersection 24 adds to the external bias field, and the stripe domain is cut in half. When the cut pulse is terminated the two halves do not recombine. As rotation continues, the bridging charged wall 29 separates, leaving a charged wall on the tip, and a separate charged wall in the cusp. The upper bubble continues around the tip 25 of the upper track 30 and back to the storage area, while the lower bubble, the replica, moves along track 27 on guide structure 21 to the left toward the detector.

Variations of this design are also within the scope of the present invention. The tip-cusp distance should be as short as possible, but should not be large enough to contain the conductor geometry. If this distance is too short, the negative potential well used for cutting occupies the entire tip-cusp gap, and the whole stripe will collapse. The "super" cusp orientation is perferred since this results in the longest, and strongest bridging wall, but other orientations are possible.

Use of more compact conductor geometries may allow a shorter tip-cusp distance, and may make this replication technique suitable for a block replicate function. One such embodiment of the present invention is shown in FIG. 3a with the associated timing diagram shown in FIG. 3b. In this embodiment, a hairpin loop conductor is not used, but instead a meandering conductor 31 disposed between the ion-implanted patterns, such as the minor loop guide structure 33 and the major loop guide structure 34.

Figure 3B:
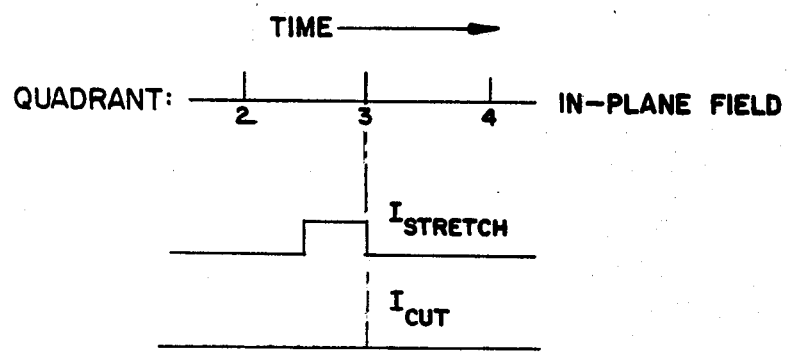
FIG. 3b is a timing diagram of in-plane magnetic drive field and the current in the conductor according to the second embodiment present invention.

The operation is as follows. Bubbles reach the minor loop tips by counterclockwise rotation of the in-plane field, shown by phase diagram 40. Between the second and third quadrants of the in-plane field as shown in FIG. 3b, a stretch pulse is applied to the major loop 34 in order to help stretching along the bridging charged wall 39. The bubble is cut by a short pulse in the conductor 31 on the third quadrant, again shown in FIG. 3b. The upper half 35 of the bubble is attracted to the minor loop tip 32 both by the charged wall and the upper side 36 of the conductor while the lower half 37 is attracted to the cusp 38 by the charged wall and the field from the stretch current, I STRETCH. The (upper half) bubble 35 remains in the minor loop 33 while the replicated (lower half) bubble 37 transfers to the detector along the major loop 34. This embodiment still only uses one conductor layer for the conductor 31 since the stretch line or major loop 34 is part of the implant mask, and does not require a separate lithography step. Because the conductor 31 does not cross the implant mask of the major loop 34, step coverage over the 0.5–0.8 um thick mask is not a fabrication problem.

This replication concept has a significant reliability advantage over the passive cut replicator described by the Nelson prior art. In the present invention, cutting is achieved with an active current pulse, a technique that has been proven to be reliable by the replicators used in conventional permalloy technology. The charged walls holding the stripe ends are not as strong as the oversized permalloy elements used in conventional replicators, but any potential problem may be corrected somewhat by the use of additional current elements, as in the block replicate design.

I claim:

1. A magnetic bubble domain device comprising:
    a planar layer of magnetic material in which magnetic bubble domains can be propagated;
    a first bubble domain guide structure coupled to said layer and defining a first bubble domain propagation path for guiding the movement of said bubble domains in said layer in response to a cyclical change in the orientation of a re-orienting magnetic field within the plane of said layer;
    a second bubble domain guide structure coupled to said layer, and defining a second propagation path for guiding the movement of said bubble domains in said layer in response to the cyclical change in orientation of said reorienting magnetic field in the plane of said layer;
    a replicate bubble domain guide structure coupled to said layer and functioning to replicate a bubble domain travelling along said first bubble propagation path onto said second bubble propagation path in response to an activating signal, characterized in that said replicate guide structure includes two spaced apart attractive positions for stretching a bubble domain in response to the charged wall movement, and conductor means disposed between said positions functioning to sever said stretched bubble domain in response to said activating signal.

2. A device as defined in claim 1 wherein said first propagation path comprises ion implanted contiguous disks.

3. A device as defined in claim 1 wherein said ion implanted contiguous disks comprise a pattern of overlapping co-linear contiguous disks.

4. A device as defined in claim 1 wherein one of said attractive positions is defined as a concave portion of an ion-implanted propagation path element of said device.

5. A device as defined in claim 1 wherein said conductor means comprises a hairpin loop.

6. A device as defined in claim 1 wherein said hairpin loop has a long access axis substantially perpendicular to the long axis of said stretched bubble domain.

7. A magnetic bubble domain device comprising:
    a layer of material in which magnetic bubbles can be moved along at least first and second paths in response to a cyclical magnetic field;
    said layer including a pattern of alternating first and second ion-implanted features for defining each of said first and second paths;
    a portion of said paths being disposed adjacent one another and exhibiting like magnetic polarity for said field oriented in a first direction;
    an electrical conductor extending between said portion of said first and second paths; and
    means for pulsing said conductor at a time when said field is in said first direction for severing a bubble domain stretched between said first and said second paths.

8. A device as defined in claim 7 wherein said conductor is disposed entirely between said first and said second paths.

* * * * *